United States Patent
Nishimura

(10) Patent No.: US 6,251,797 B1
(45) Date of Patent: Jun. 26, 2001

(54) METHOD OF FABRICATING SEMICONDUCTOR DEVICE

(75) Inventor: Isamu Nishimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/515,670

(22) Filed: Feb. 29, 2000

(30) Foreign Application Priority Data

Feb. 26, 1999 (JP) .................................................. 11-051207

(51) Int. Cl.[7] .................................................. H01L 21/00
(52) U.S. Cl. .................... 438/745; 438/613; 438/737; 438/754
(58) Field of Search .................... 438/613, 614, 438/617, 637, 672, 719, 720, 737, 742, 745, 751, 753, 754, 756; 216/14, 18

(56) References Cited

U.S. PATENT DOCUMENTS

| | | | |
|---|---|---|---|
| 5,236,870 | * 8/1993 | Sakata et al. | ..................... 438/742 X |
| 5,462,638 | * 10/1995 | Datta et al. | ..................... 438/754 X |
| 5,508,229 | * 4/1996 | Baker | ..................... 438/754 X |
| 5,773,359 | * 6/1998 | Mitchell et al. | ..................... 438/754 X |
| 6,028,011 | * 2/2000 | Takase et al. | ..................... 438/754 X |

* cited by examiner

*Primary Examiner*—William Powell
(74) *Attorney, Agent, or Firm*—Rader, Fishman & Grauer

(57) ABSTRACT

In the present invention, an electrode having a structure in which a barrier layer 16 and a seed layer 17 are stacked on an electrode 12b is formed. In the electrode having such a structure, when an Al wiring film is formed, the barrier layer 16 and the seed layer 17 may be stacked by sputtering after the wiring film is formed. That is, at the time of forming wiring, the barrier layer 16 and the seed layer 17 may be stacked on the surface of the wiring. Accordingly, the formation of a bump and particularly, the formation of the seed layer for the bump are performed together with the wiring formation and protective film formation processing. Accordingly, the steps of fabricating a semiconductor are simplified, so that a time period required for the fabrication is shortened.

2 Claims, 4 Drawing Sheets

METHOD OF FABRICATING SEMICONDUCTOR DEVICE

This application is based on an application No. 11-51207 filed in Japan, the content of which is incorporated hereinto by reference.

BACKGROUND OF THE INVENTION

1. Field of the Invention

The present invention relates generally to a method of fabricating a semiconductor device, and more particularly, to a method of fabricating a semiconductor device in which a method of forming a bump provided as connecting means on the surface of the semiconductor device is improved.

2. Description of the Related Art

In fabricating a semiconductor device, a bump forming step is carried out after a wiring forming step for forming predetermined wiring and a protective film forming step for forming a protective film on the surface of a semiconductor substrate are terminated.

In the bump forming step, a series of processing such as sputtering, photolithography, plating, resist stripping, etching, and annealing is performed.

Specifically, description is made with reference to FIGS. 1A to 1E.

A TiW barrier layer 3 and an Au seed layer 4 are continuously formed, respectively, by sputtering on an aluminum electrode 2 exposed from a hole 1a formed in a protective film 1. The barrier layer 3 and the seed layer 4 are formed so as to cover not only the surface of the electrode 2 but also the surface of the protective film 1 (FIG. 1A).

A resist 5 is then formed such that only an upper part of the electrode 2 is exposed by photolithography (FIG. 1B).

After the resist 5 is formed, a bump 6 is provided by plating (FIG. 1C).

After the bump 6 is formed, the resist 5 is stripped (FIG. 1D).

Thereafter, unnecessary parts of the seed layer 4 and the barrier layer 3 are etched away. The surface of the bump 6 is slightly ground as the etching is performed (FIG. 1E). The semiconductor substrate is finally baked by an oven.

In the conventional steps of fabricating the semiconductor device, the bump forming step comprising the series of processing is carried out after the protective film forming step is terminated, as described above. Accordingly, the number of steps of fabricating the semiconductor device is large, so that a time period required for the fabrication is lengthened.

SUMMARY OF THE INVENTION

The present invention has been made in order to solve such problems and has for its one object to shorten a time period required to fabricate a semiconductor.

Another object of the present invention is to provide a method of fabricating a semiconductor, in which a bump can be formed, more simply than that in a conventional example, by improving a bump forming step.

The present invention is directed to a method of fabricating a semiconductor device, characterized in that the step of forming wiring on the surface of a semiconductor substrate comprises the steps of forming a conductive film for wiring, stacking on the formed conductive film a barrier layer and a seed layer which are required to form a bump later in this order, and patterning the conductive film for wiring on which the barrier layer and the seed layer have been stacked, to form wiring, covering the surface of the semiconductor substrate on which the wiring has been formed with a protective film, and forming an opening in the protective film on the wiring, to expose as an electrode the surface of the wiring on which the barrier layer and the seed layer have been stacked.

In the above-mentioned method, it is preferable that the bump is directly formed in a self-alignment manner by electroless plating on the seed layer exposed as the electrode.

According to the present invention, in the wiring forming step, a conductive film for wiring, an aluminum film, for example, is coated by sputtering, for example. A TiW barrier layer, for example, is further stacked thereon, and an Au seed layer, for example, is further stacked thereon.

A stacked film comprising the conductive film, the barrier layer and the seed layer is formed into a wiring pattern by photolithography, for example.

As a result, the barrier layer and the seed layer which are used for forming a bump later are previously formed in a portion, which is exposed as an electrode from the surface of the semiconductor substrate, of the formed wiring pattern.

In thus forming the wiring pattern, if the barrier layer and the seed layer for forming the bump are previously stacked, a desired barrier layer and a desired seed layer are simultaneously obtained by photolithography for patterning the wiring, for example.

The barrier layer and the seed layer are previously stacked on the surface of the electrode. Accordingly, the seed layer is subjected to electroless plating, thereby making it possible to directly grow the bump in a self-alignment manner on the seed layer on the surface of the electrode using the protective film as a resist.

The same processing as normal wiring formation may be only performed except that the seed layer for forming the bump is formed by film forming processing such that at the time of forming the conductive film in forming the wiring, the seed layer is stacked on the surface of the conductive film, as described above. If the seed layer forming processing is previously performed, the seed layer for forming the bump is provided on the surface of the electrode at the time point where the wiring formation and protective film formation processing are terminated.

Accordingly, the bump can be easily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 2A to 2G are illustrative cross-sectional views showing wiring and electrode forming steps in a case where a silicon substrate is used as a semiconductor substrate.

Figure 1A:
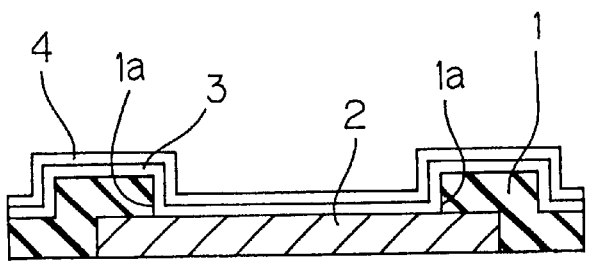
FIGS. 1A to 1E are illustrative cross-sectional views for explaining a conventional bump forming step.
Figure 1B:
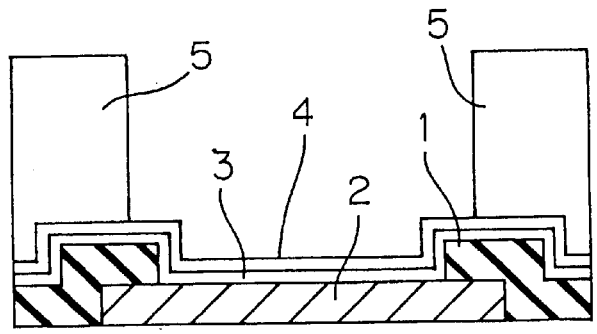
Figure 1C:
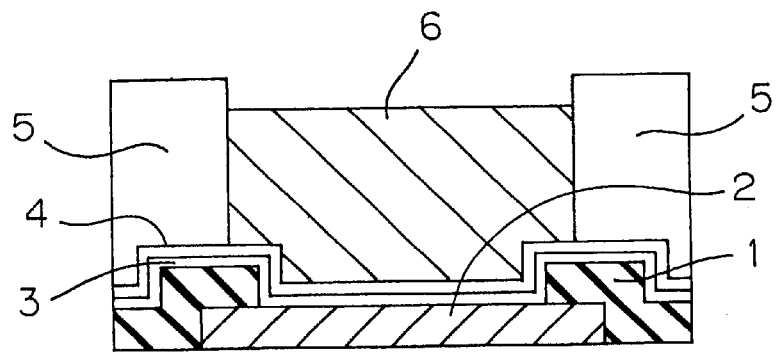
Figure 1D:
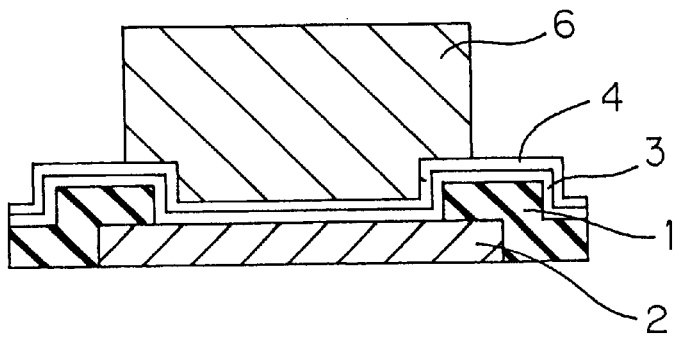
Figure 1E:
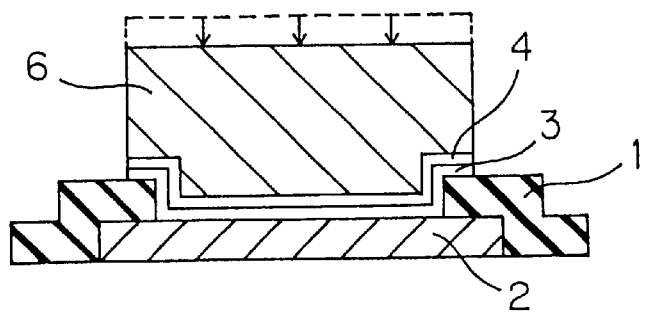
Figure 2:
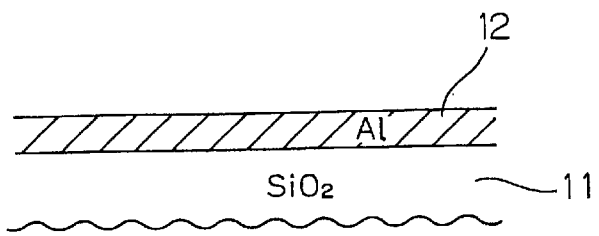
FIGS. 2A to 2G are illustrative cross-sectional views for explaining a general example of a wiring forming step.
Figure 2:
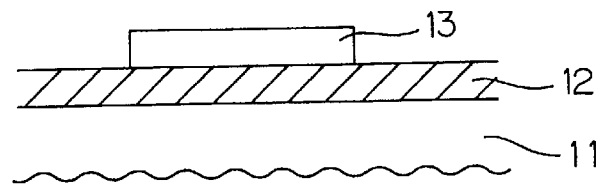
Figure 2:
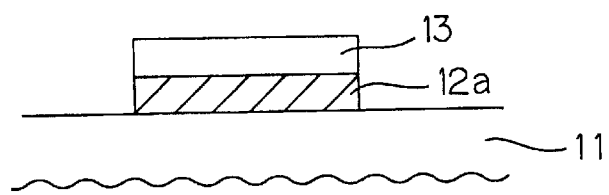
Figure 2:
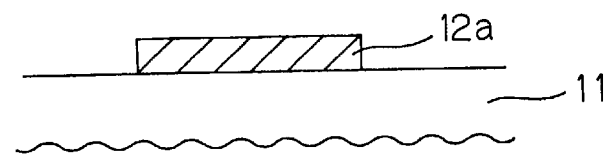
Figure 2:
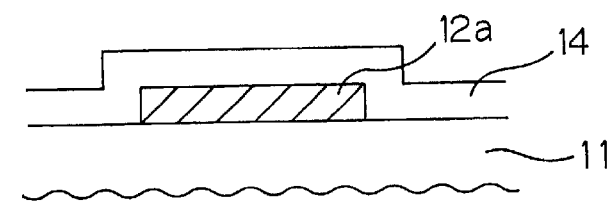
Figure 2:
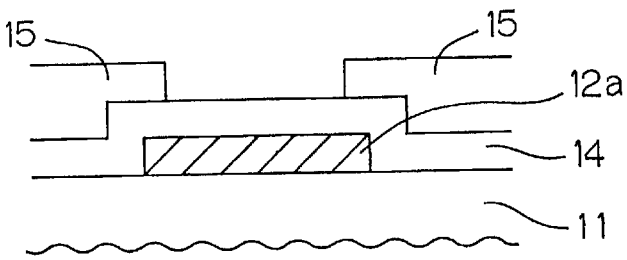
Figure 2:
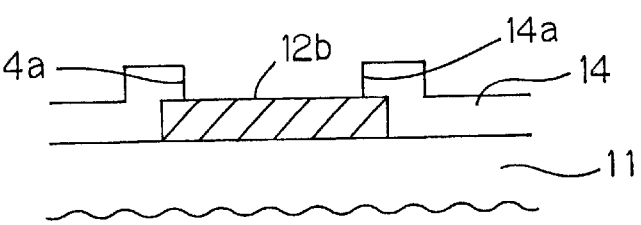

An aluminum (Al) wiring film 12, for example, is made to adhere to an SiO$_2$ insulating film 11 by sputtering, for example (FIG. 2A). The wiring film 12 left as a wiring pattern 12a is covered with a resist 13 (FIG. 2B), an unnecessary part of the wiring film 12 is removed by photolithography (FIG. 2C), and the resist 13 is stripped, to form the wiring pattern 12a (FIG. 2D).

In order to protect a formed device, the surface of the semiconductor substrate is then covered with a protective film (a passivation film) 14. The passivation film 14 is formed by vapor phase epitaxy, for example.

Thereafter, an opening 14a is formed in the passivation film 14, so that a part of the wiring pattern 12a is exposed as an electrode 12b. Specifically, a photoresist is applied over the passivation film 14, followed by pattern exposure, so that an opening resist 15 is formed on the electrode (FIG. 2F). The passivation film 14 is selectively removed by etching to form an opening 14a, so that the electrode 12b is exposed. Thereafter, the resist 15 is stripped (FIG. 2G).

The foregoing are general steps of forming the wiring and the electrode. In the present embodiment, however, the steps are carried out in the following manner.

Figure 3:
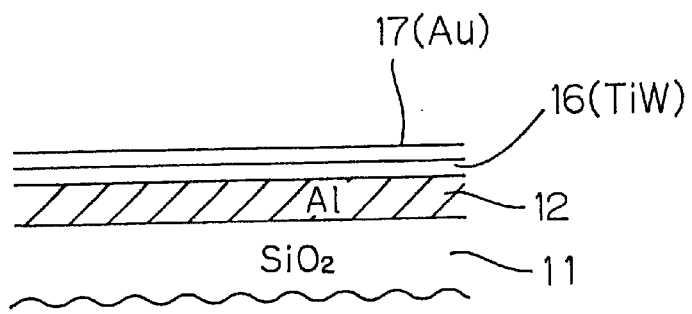
FIGS. 3A and 3B are illustrative cross-sectional views showing a part of a wiring forming step according to the present embodiment.
Figure 3:
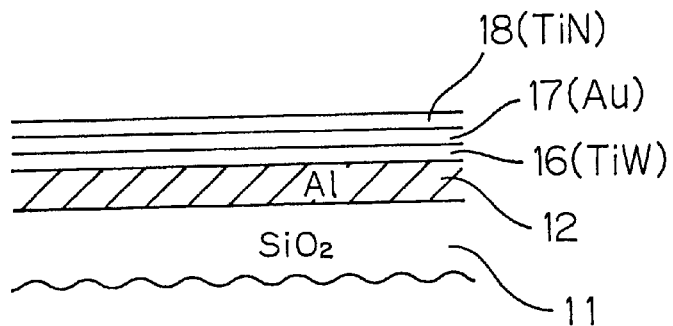

At the time of forming the wiring film 12 shown in FIG. 2A, a TiW barrier layer 16 and an Au seed layer 17 are stacked, as shown in FIG. 3A. The barrier layer 16 and the seed layer 17 can be formed by sputtering, similarly to the wiring film 12.

As shown in FIG. 3B, a reflection preventing film 18 made of titanium nitride (TiN), for example, may be further formed by sputtering on the seed layer 17.

Figure 4:
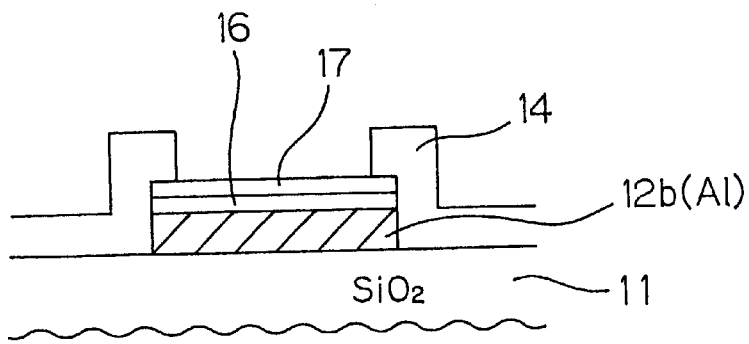
FIGS. 4A and 4B are illustrative cross-sectional views showing the structure of an electrode formed by fabricating steps according to an embodiment of the present invention.
Figure 4:
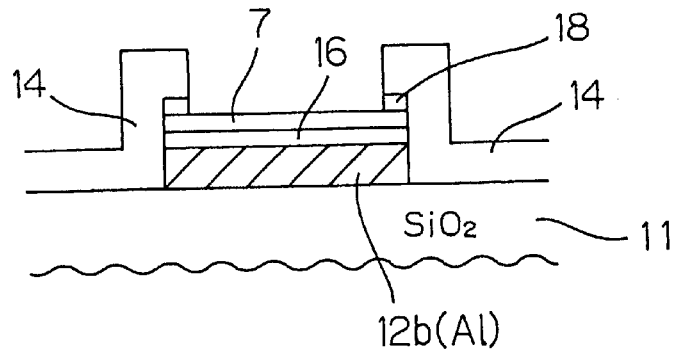

In the film formation processing shown in FIG. 2A, when not only the wiring film 12 but also the barrier layer 16 and the seed layer 17 are formed, an electrode having a structure shown in FIG. 4A is obtained by thereafter performing the processing shown in FIGS. 2B to 2F. That is, the barrier layer 16 and the seed layer 17 are stacked on the electrode 12b.

In a case where the reflection preventing film 18 is further stacked, as shown in FIG. 3B, if the reflection preventing film 18 is also etched in the step of forming the opening 14a in the passivation film 14, it is possible to obtain an electrode having a structure in which the reflection preventing film 18 is provided at a peripheral edge of the seed layer 17 (a peripheral edge of the seed layer 17 which is covered with the passivation film 14), as shown in FIG. 4B.

The reflection preventing film 18 is provided such that Au which is the seed layer 17 is not reflected to the periphery, and a bump can be satisfactorily formed because the reflectance of Au is high. The reflection preventing film 18 is not necessarily required.

As shown in FIGS. 4A and 4B, if the barrier layer 16 and the seed layer 17 are previously formed on the surface of the electrode 12b, an Au bump can be directly formed by electroless plating, for example, on the seed layer 17.

The electroless plating is performed by containing a semiconductor substrate comprising an electrode having a structure shown in FIG. 3A or 3B in a predetermined chamber and spraying or soaking an Au plating solution in the chamber, which is not illustrated. The passivation film 14 functions as a protective film by spraying or soaking the Au plating solution, so that Au plating grows in a self-alignment manner on the surface of the seed layer 17 (an opening). As a result, a flat dome-shaped bump 20 is formed, as shown in FIG. 5.

Figure 5:
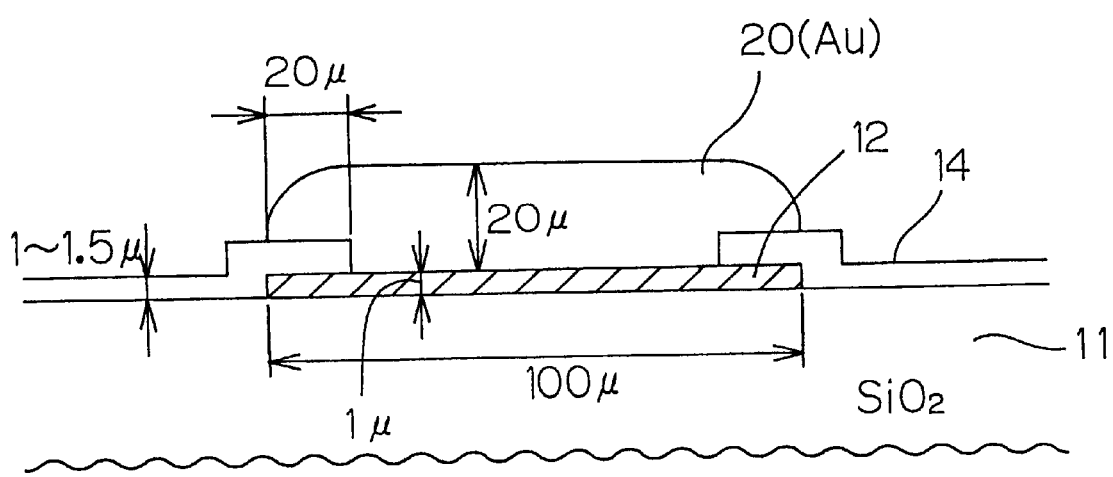
FIG. 5 is an illustrative cross-sectional view showing the structure of a bump formed according to an embodiment the present invention.

As shown in FIG. 5, the thickness of the formed bump 20 from the surface of the electrode is approximately 20 $\mu$. If the other dimensions are exemplified at this time, the width of the electrode is approximately 100 $\mu$, the thickness thereof is approximately 1 $\mu$, and the thickness of the passivation film 14 is approximately 1 to 1.5 $\mu$. Further, the thickness of the passivation film 14 with which the electrode is coated is approximately 20 $\mu$.

As described in the foregoing, the seed layer for forming the bump is previously provided on the surface of the electrode, thereby making it possible to form the bump only in an opening of the protective film (the surface of the electrode) by electroless plating or the like. Consequently, the bump is formed together with the wiring formation and protective film formation processing. Accordingly, the steps of fabricating a semiconductor are simplified, so that a time period required for the fabrication is shortened.

Although in the above-mentioned bump formation, an example in which the bump is formed of Au is illustrated, the bump can be also formed of Pd, Pt, Ag, Ir, Ni, Cu, or the like in addition to Au. When the bump is formed of such a material, the seed layer may be formed of the same material.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a semiconductor device, wherein the step of forming wiring on the surface of a semiconductor substrate comprises the steps of forming a conductive film for wiring, stacking on the formed conductive film a barrier layer and a seed layer which are required to form a bump later in this order, and patterning the conductive film for wiring on which the barrier layer and the seed layer have been stacked, to form wiring, covering the surface of the semiconductor substrate on which the wiring has been formed with a protective film, and forming an opening in the protective film on the wiring, to expose as an electrode the surface of the wiring on which the barrier layer and the seed layer have been stacked.

2. The method of fabricating a semiconductor device according to claim 1, further comprising the step of directly forming a bump in a self-alignment manner by electroless plating on the seed layer exposed as the electrode.

* * * * *